United States Patent
Forsyth et al.

(10) Patent No.: US 6,933,033 B1
(45) Date of Patent: Aug. 23, 2005

(54) SCRIBED INTERLEAF SEPARATOR WAFER PACKAGING

(75) Inventors: Valoris L. Forsyth, Lewisville, TX (US); Sandrine Charrier, Stockbridge (GB)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/919,640

(22) Filed: Aug. 17, 2004

Related U.S. Application Data

(60) Provisional application No. 60/587,884, filed on Jul. 13, 2004.

(51) Int. Cl.⁷ ............................ B32B 3/02; H01L 21/30
(52) U.S. Cl. ...................... 428/64.1; 206/710; 428/167
(58) Field of Search ................. 438/458; 53/372.1, 53/445; 428/177.2, 64.1, 167, 114, 214, 35.2; 206/710, 494

(56) References Cited

U.S. PATENT DOCUMENTS

| | | | |
|---|---|---|---|
| 5,091,229 A * | 2/1992 | Golike et al. ............... | 428/35.2 |
| 5,183,699 A * | 2/1993 | Takemura et al. ........... | 428/214 |
| 6,533,123 B1 * | 3/2003 | Nakamura et al. ........... | 206/710 |
| 2002/0014435 A1 * | 2/2002 | Bores et al. ................. | 206/710 |
| 2003/0056471 A1 * | 3/2003 | Linker et al. ................. | 53/445 |
| 2004/0048028 A1 * | 3/2004 | Thomas et al. ............. | 428/64.1 |
| 2004/0146690 A1 * | 7/2004 | Vermillion ................... | 428/114 |

* cited by examiner

*Primary Examiner*—Olik Chaudhuri
*Assistant Examiner*—B. Keshavan
(74) *Attorney, Agent, or Firm*—Pitney Hardin LLP

(57) ABSTRACT

A separator of semiconductor wafers is made from polyethylene with a dissipative material and includes a first and second set of embossed cut perpendicular lines. The first set is typically parallel to the second set, and each set includes pairs of cut lines which are spaced from adjacent pairs. The depth of grid lines cut into the material allows air flow, circulation and vacuum release.

5 Claims, 1 Drawing Sheet

SCRIBED INTERLEAF SEPARATOR WAFER PACKAGING

This application claims priority, as a continuation-in-part, from provisional application Ser. No. 60/587,884 filed on Jul. 13, 2004.

BACKGROUND OF INVENTION

1. Field of Invention

This invention pertains to separators used for the packaging and transport of semiconductor wafers.

2. Description of the Prior Art

In order to maintain electrostatic and mechanical stability during shipping and transport of semiconductor wafers, it is common to use separators between adjacent wafers. One prior art wafer separator uses an embossed grid pattern. While this has been satisfactory in many respects, there have been occurrences of semiconductor wafers and separators within a multi-box canister wherein the wafers and separators have been found stuck together. This produces a "wafer cake" configuration wherein one stack of wafers and separators is difficult to break down. This can cause breakage of the wafers when trying to separate them from the separators. This is typically done manually without the use of automated unpacking equipment. This problem may be caused by the grid pattern embossed on the separators. Each individual square of the grid may behave like a small sucker pad when the wafers are vacuum packed.

OBJECTS AND SUMMARY OF THE INVENTION

In order to overcome the above deficiencies, a separator is provided with a pattern of lines, typically two sets of lines orthogonal to each other. This allows air to flow and circulate. This further provides for vacuum release.

The separators are typically polyethylene, impregnated with a dissipative material, and provided in a circular shape, with many different diameters available.

DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
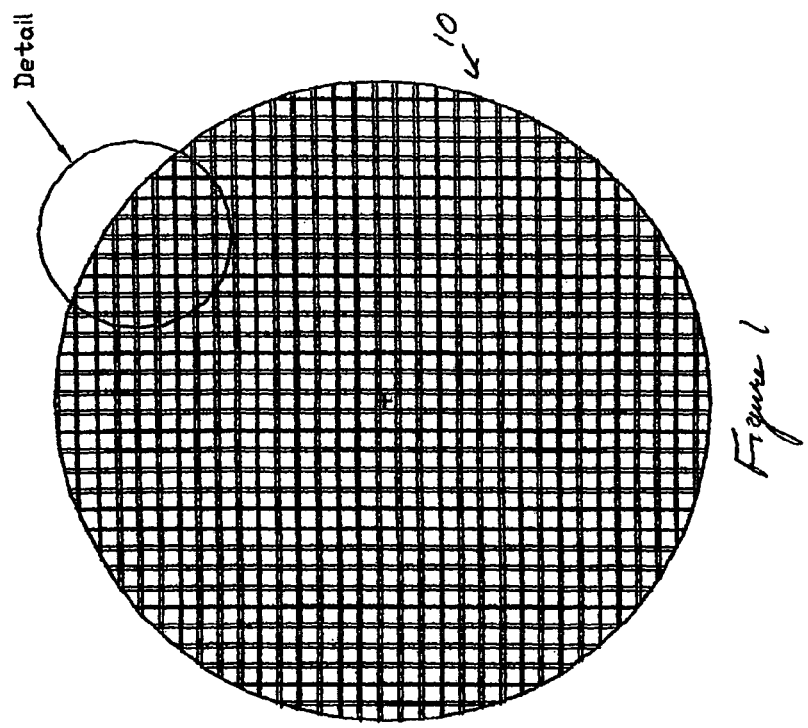
FIG. 1 is a plan view of the wafer separator of the present invention.

FIG. 1 is a plan view of a circular wafer separator 10 of the present invention. Wafer separator 10 may be provided in virtually any shape and size, but circular wafer separators 10 with a 4, 5, 6, 8 or 12 inch diameter are particularly envisioned.

Wafer separator 10 is typically made from a polyethylene material, such as Richmon/Valeron®, such as 1207 LLDPE Lamination Grade Film (86-R0438) which is sold by assignee Illinois Tool Works Inc., using the specification number 86-R0438 which details the formulation and property requirements for this antistatic film. Wafer separator 10 is typically 0.006 inches thick, impregnated with a dissipative material which is typically processed to insure that the dissipative material is a part of the material structure while keeping the organic and inorganic contaminate levels below 50 ppm, which is ideal for semiconductor applications.

Figure 2:
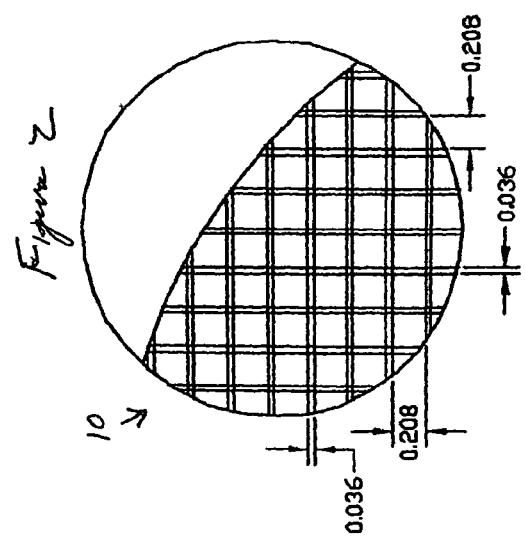
FIG. 2 is a detailed view of a portion of FIG. 1.

Circular wafer separator 10 is embossed with a first and second set of cut parallel lines, the first set of cut parallel lines typically being perpendicular to the second set of cut parallel lines. Both ends of each line terminate on the periphery of circular wafer separator 10. Moreover, as best shown in FIG. 2, the cut parallel lines are typically paired so that the lines within a pair are typically 0.036 inches apart and the pairs are 0.208 inches from adjacent pairs and are cut to a sufficient depth to enable air flow and circulation, providing vacuum release.

Thus the several aforementioned objects and advantages are most effectively attained. Although a single preferred embodiment of the invention has been disclosed and described in detail herein, it should be understood that this invention is in no sense limited thereby and should be determined by the appended claims.

What is claimed is:

1. A separator for separating semiconductor wafers, the separator being comprised of electrostatic dissipative material and including a first set of cut lines and a second set of cut lines, wherein the first set of cut lines is perpendicular to the second set of cut lines and wherein both ends of the cut lines terminate on the periphery of said separator.

2. The separator of claim 1 wherein said first and second sets of cut lines are configured in pairs of cut lines, wherein the lines within a given pair are spaced a first distance apart and adjacent pairs of lines are spaced a second distance apart, wherein said first distance is different from said second distance.

3. The separator of claim 1 wherein said cut lines are cut to a sufficient depth to provide air flow, circulation and vacuum release.

4. The separator of claim 1 wherein said separator is circular.

5. The separator of claim 1 wherein said separator is comprised of a polyethylene material.

* * * * *